United States Patent

Fahmi et al.

Patent Number: 6,128,766
Date of Patent: Oct. 3, 2000

[54] HIGH SPEED CYCLIC REDUNDANCY CHECK ALGORITHM

[75] Inventors: Maher Nihad Fahmi, North Vancouver; Stephen Julien Dabecki, Maple Ridge, both of Canada

[73] Assignee: PMC-Sierra Ltd., Burnaby, Canada

[21] Appl. No.: 08/745,864

[22] Filed: Nov. 12, 1996

[51] Int. Cl.[7] .................................................. G06F 11/10
[52] U.S. Cl. .................... 714/807; 714/758; 714/757; 714/752
[58] Field of Search ................ 371/53, 48, 37.7, 371/37.6; 714/807, 799, 758, 757, 752

[56] References Cited

U.S. PATENT DOCUMENTS 3,753,225  8/1973  Liddell ................................ 340/146.1
5,369,649  11/1994  Murayama et al. ................... 371/37.1
5,661,722  8/1997  Miyagi .................................. 370/235

Primary Examiner—Phung N. Chung
Attorney, Agent, or Firm—Pascal & Associates

[57] ABSTRACT

A method of determining an error detection code (EDC) on incoming data which includes a reserved bit field, comprising applying the incoming data to inputs of both an input data CRC (IDC) calculator and to an input data and reserved field CRC (IDRC) calculator, calculating the EDC on successive input data words and recursively updating the EDC in both the IDC and IDRC calculators, selecting a payload of the input data as a system output signal for all payload words, and subsequently selecting a output EDC word from the IDRC calculator in a time immediately following a final payload word which contains the reserved field.

9 Claims, 4 Drawing Sheets

HIGH SPEED CYCLIC REDUNDANCY CHECK ALGORITHM

FIELD OF THE INVENTION

This invention relates to the field of data transmission, and in particular to a method and apparatus for performing cyclic redundancy checks of the data.

BACKGROUND TO THE INVENTION

Cyclic redundancy check (CRC) is commonly performed on data, to determine whether errors have been incorporated into the data. Prior to transmission, payload data is processed through a polynomial, and a resulting word (an error detection code EDC) is generated and is appended to the data. At a receiving end, the payload data is processed through the same polynomial in a CRC circuit. If the same EDC results, the received data is considered to be valid. Errors in the data will of course result in a different EDC, and the receiving equipment will then typically signal the data transmitter to repeat the data sequence.

Originally, data was applied to a CRC circuit in a bit-serial fashion. However, in order to obtain a high throughput, such as is required in asynchronous transfer mode (ATM) circuits, the payload data must be input to the CRC circuit in a bit parallel fashion. The bit parallel data input presents a problem for CRC implementations. For example, in the system described in the publication "High Speed Parallel CRC Circuits in VLSI", by T. Pei and C Zukolowsi, IEEE Transactions on Communications, pp. 653–657, Vol. 40, No. 4, April, 1992, the signal translation algorithms require that the input data wordlength should be smaller than the CRC generator polynomial wordlength. Thus, in the case of ATM cells, the input data word must be 10 bits or less. This imposes a throughput restriction.

In addition, a reserved field in the 47th byte of the payload of the ATM AIS cell can present a problem for parallel CRC-10 (CRC polynomial having a 10 bit detection code) generators. If the input wordlength is not equal to the reserved field wordlength, an additional cycle is required to compute the CRC of the cell, since such CRC computations assume a fixed input wordlength. Thus, in this case the input wordlength would have to be 6 bits, (to accommodate 10 bits, two parallel 6 bit CRC calculations must be used) which can reduce the overall throughput of the device.

SUMMARY OF THE INVENTION

The present invention allows data wordlengths which are greater than the order of the CRC generating polynomial wordlength to be checked. Different data wordlengths can be used, applied to the same CRC generating polynomial. Further, the additional cycle required to compute a CRC-10 for ATM Operations, Administration and Maintenance (OAM) cells is eliminated, thus speeding throughput.

In accordance with an embodiment of the invention, a method of calculating an error detection code (EDC) on incoming data having words in parallel format and having a final word which includes a reserved bit field, is comprised of calculating an EDC on successive words of an input bit stream, applying successive words of the input bit stream to an output bus, performing a look-ahead EDC calculation on the final word, and applying the result of the EDC calculation on the final word in a time interval immediately following the final word on the output bus.

In accordance with another embodiment, a method of determining an error detection code (EDC) on incoming data which includes a reserved bit field, is comprised of applying the incoming data to inputs of both an input data CRC (IDC) calculator and to an input data and reserved field CRC (IDRC) calculator, calculating the EDC on successive input data words and recursively updating the EDC in both the IDC and IDRC calculators, selecting a payload of the input data as a system output signal for all payload words, and subsequently selecting an output EDC word from the IDRC calculator in a time immediately following a final payload word which contains the reserved field.

In accordance with another embodiment, a system for determining an error detection code (EDC) on a bit stream comprising a payload formed of a sequence of words followed by a reserved field, is comprised of an input data CRC (EDC) calculator, an input data and reserved field CRC (IDRC) calculator, apparatus for applying input data in parallel format to inputs of the calculators, first apparatus for selecting an output of either of the calculators to a CRC output, first delaying apparatus for delaying by a word interval the output of either of the calculators prior to application of said output to the CRC output, apparatus for applying a signal from the delayed CRC output to recursive update inputs of the calculators, second apparatus for selecting either the input data or the signal from the delayed CRC output to a system output, apparatus for applying a signal to said first apparatus, for selecting an output of the EDC calculator for application to the delaying apparatus for application to the delayed CRC output during an interval of each word of the input data until the occurrence of a last input word, and for subsequently selecting an output of said IDRC calculator for application to the delaying apparatus for application to the delayed CRC output during the last input word, and apparatus for applying a signal to the second apparatus for selecting during an interval of each word of the input data, for selecting the delayed CRC output during an interval following said last input word.

BRIEF INTRODUCTION TO THE DRAWINGS

A better understanding of the invention will be obtained by considering the detailed description below, with reference to the following drawings, in which.

DETAILED DESCRIPTION OF PREFERRED EMBODIMENTS OF THE INVENTION

Figure 1:
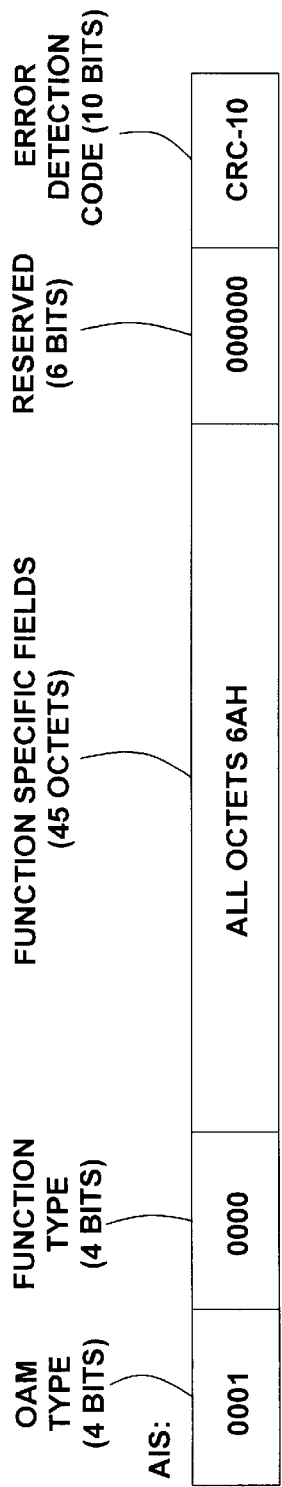
FIG. 1 is a diagram of an ATM OAM cell.

Turning first to FIG. 1, an ATM OAM cell is shown, which is of the form of an Alarm Indication Status (AIS) cell, as an example. This cell is comprised of four bits signifying the type of OAM the cell designates, followed by 4 bits signifying the function type. This is followed by 45 octets which constitute a function specific field. A 6 bit reserved field follows. These fields constitute the payload of the cell. The payload is followed by the CRC-10 error detection code, of 10 bits.

To compute the CRC-10 of this cell, the payload data are input to a calculating circuit, and are divided (over a Galois Field 2) by a generating polynomial. The CRC-10 EDC generating polynomial is $$x^{10}+x^9+x^5+x^4+x+1.$$

Figure 2A:
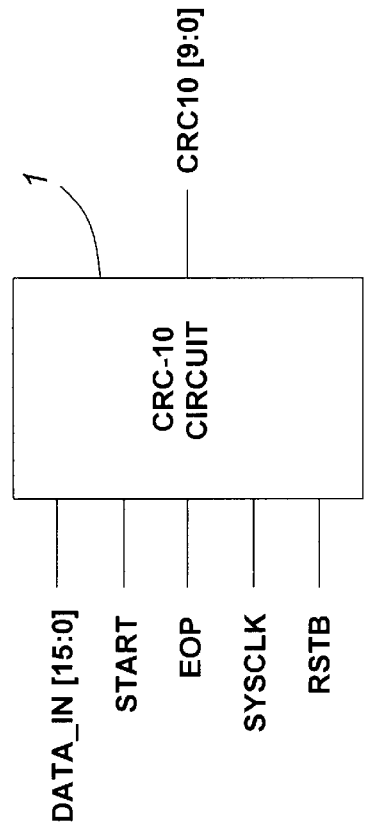
FIG. 2A is a block diagram of an embodiment of the invention in general form.

In accordance with an embodiment of the invention, the input data (data_in) is applied in parallel to a CRC-10 circuit 1 as shown in FIG. 2A. The input to the circuit 1 is illustrated as having 16 parallel input lines data_in(15:0).

Other inputs to the circuit receive a start signal, an eop signal, a sysclk signal, and an rstb signal. The circuit provides parallel output lines crc10(9:0), which are 10 lines each of which carries one bit of the 10 bit CRC calculated data byte, the error detection code.

Other than the input signal, the input signals are obtained from an external processor, clock, or timer, in accordance with the external design, the timing of which will be described later.

Figure 2B:
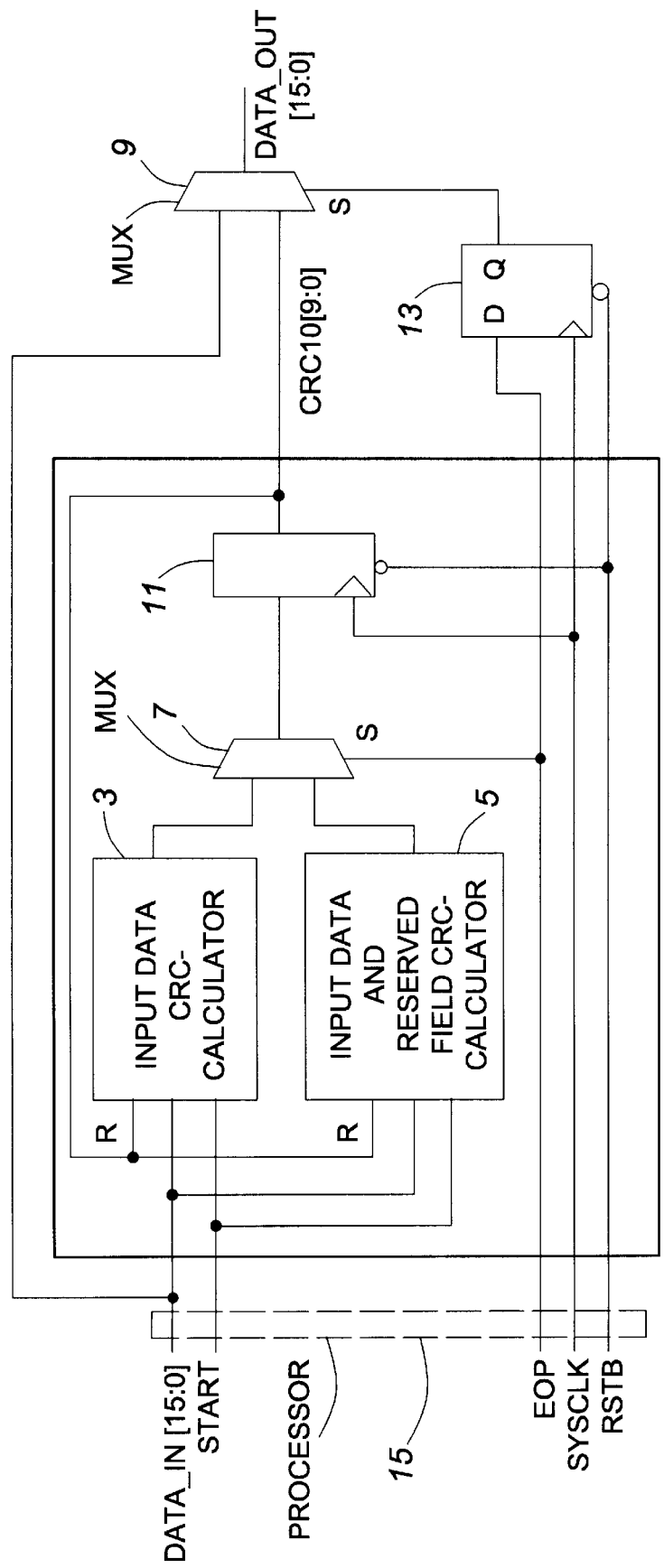
FIG. 2B is a block diagram of the embodiment of FIG. 2A, in more detail.

The system is illustrated in FIG. 2B in more detail.

Each of a pair of CRC calculators 3 and 5 receives the input signal data_in(15:0) in parallel with the other. Each calculator can process the input signal in accordance with the transfer function (algorithm) $x^{10}+x^9+x^5+x^4+x+1$, in a well known manner, and can, for example, be comprised of a microprocessor, or an application specific integrated circuit (ASIC).

To distinguish between the two CRC calculators for a reason which will become apparent below, one calculator will be referred to as the input data CRC (IDC) calculator 3, and the other will be referred to as the input data and Reserved field CRC (IDRC) calculator 5.

The outputs of the calculators 3 and 5 are in communication with corresponding inputs of a multiplexer 7, the output of which is in communication with an input of a multiplexer 9, through a flip flop 11. The output leads of flip flop 11 is labeled, and carries the crc10(9:0) signal.

The crc10(9:0) lines are connected to recursive inputs R of the calculators 3 and 5.

The eop signal is applied to the select input S of multiplexer 7, as well as to the data input D of a flip flop 13, the Q output of which is connected to the select input S of multiplexer 9. The sysclk signal is applied to clock inputs of flip flops 11 and 13. The rstb input is connected to reset inputs of flip flops 11 and 13. The start signal is applied to a start input of each of the calculators 3 and 5.

The sysclk signal is the system clock, and completes one cycle over a period of one data word. The data_in(15:0) input represents the payload data of ATM cells, over which a CRC-10 error detection code is computed.

The start signal clears the fed-back CRC-10(9:0) polynomial calculation, and allows intermediate CRC calculations to be accumulated.

The eop (end of payload) signal indicates that the final input_data(15:0) payload word is input.

The rstb (reset, active low) signal clears the flip flops 11 and 13, and is an asynchronous signal.

The aforenoted input signals can be obtained from an external processor 15 which indicates the beginning and end of the input signal payload, provides the timing and other signals referred to above.

The crc10(9:0) signal represents the CRC-10 calculation value over the payload of an ATM cell.

Figure 3:
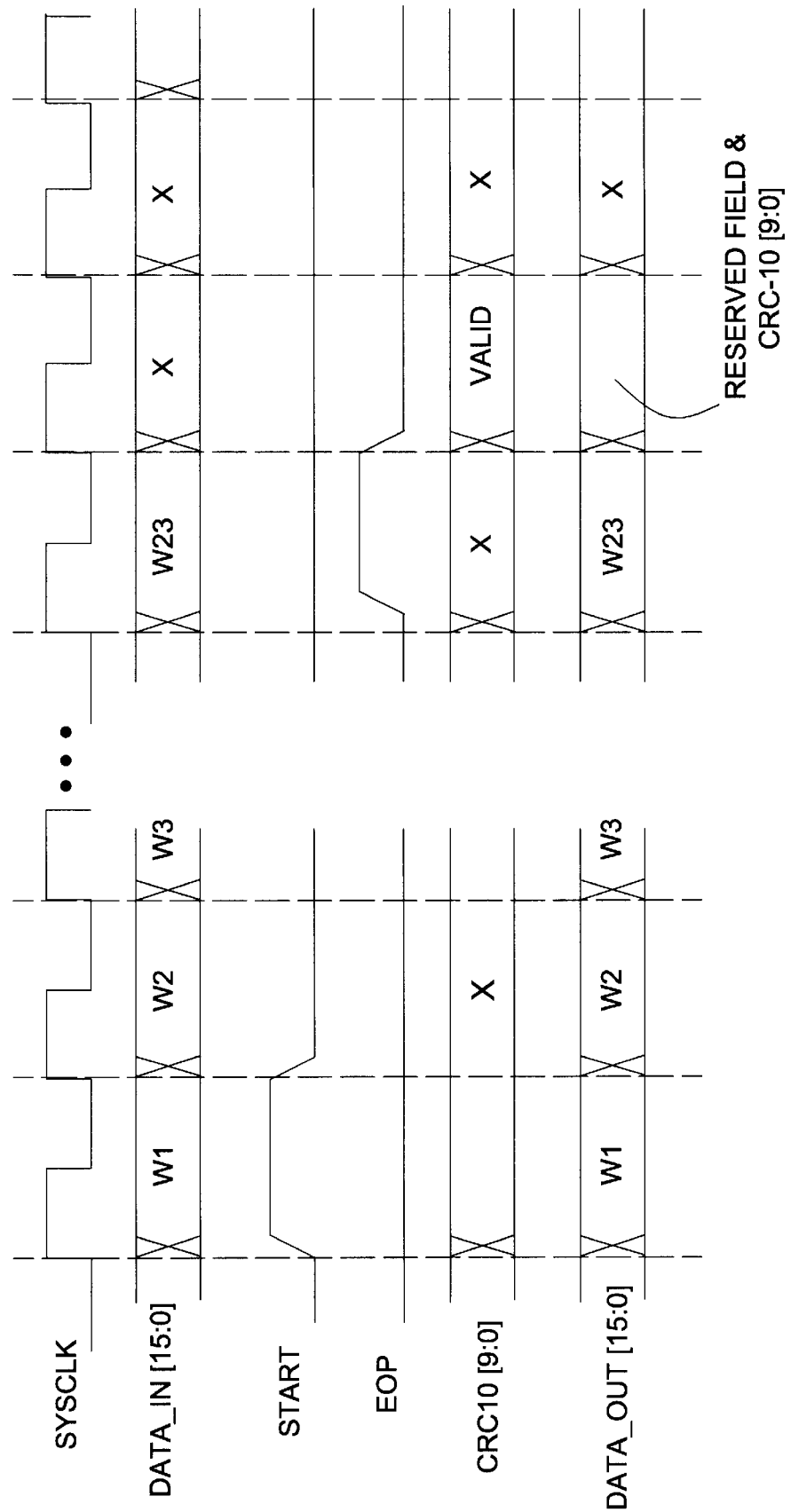
FIG. 3 is a timing diagram of signals used by the embodiment illustrated in FIG. 2B.

Reference is now made to FIG. 3, which is a timing diagram of the aforenoted signals, as well as FIG. 2B.

The data_in(15:0) input data is input to both calculators 3 and 5 in synchronization with the rising edge of the system clock signal sysclk. The start signal goes high in synchronization with the first word W1 of the input data cell. Both calculators are thereby cleared and begin calculating the EDC on the same input data words.

However, the eop signal is low. Thus the multiplexer 7 selects the output of calculator 3 to pass to its output. This data passes through flip flop 11, which is clocked system clock signal sysclk, resulting in a one word delay. The calculated CRC thus appears on leads crc10(9:0) delayed by one data word.

The crc10(9:0) signal is fed back to the calculators 3 and 5, which recursively updates the crc10(9:0) output word.

In the meantime, multiplexer 9 has its select input at low level, such that it selects the data_in(15:0) signal to pass to its output data_out(15:0). Each of the input words W1, W2, . . . W23 is thus passed to and appears on the data_out(15:0) leads.

Once the final input word W23 appears, processor 15 recognizes that it is the final word of the payload of the cell, and changes the eop signal logic level to high. This causes the multiplexer 7 to change its input to select the output of calculator 5, and applies it to the parallel inputs of flip flop 11. With a one word delay caused by flip flop 11, the result of the error detection code calculated by calculator 5 passes to the crc10(9:0) leads.

The eop signal also is applied to the select input S of multiplexer 9, with a one word delay caused by it passing through flip flop 13. The latter delay provides the time for the last payload word W23 to pass through multiplexer 9. In the immediately following clock (word) interval, the multiplexer selects the signal input from the crc10(9:0) leads, i.e. the error detection code generated by calculator 5, to pass to the output leads data_out(15:0), as may be seen in the bottom-most timing chart labeled data_out(15:0) of FIG. 3. Since the final word W23 of the payload includes the reserved field, the error detection code which includes this field is calculated in calculator 5, and is appended to the payload in the time slot immediately following the final word W23 of the payload, on the output lines.

It may be seen that by the use of two CRC calculators, in affect a look-ahead calculation is performed on the EDC in addition to the final payload data word W23, which allows the EDC to be placed and output immediately following the final payload word.

Two sets of polynomial equation processing is performed in parallel, one computing the intermediate CRC calculations for the case in which the input data only are input, and one for the case in which the input data and the reserved field are input simultaneously. This allows for arbitrary length data input wordlengths, wherein the input wordlength is not restricted to be less than the generator polynomial wordlength, and does not introduce a latent cycle in generating the output EDC.

Figure 4:
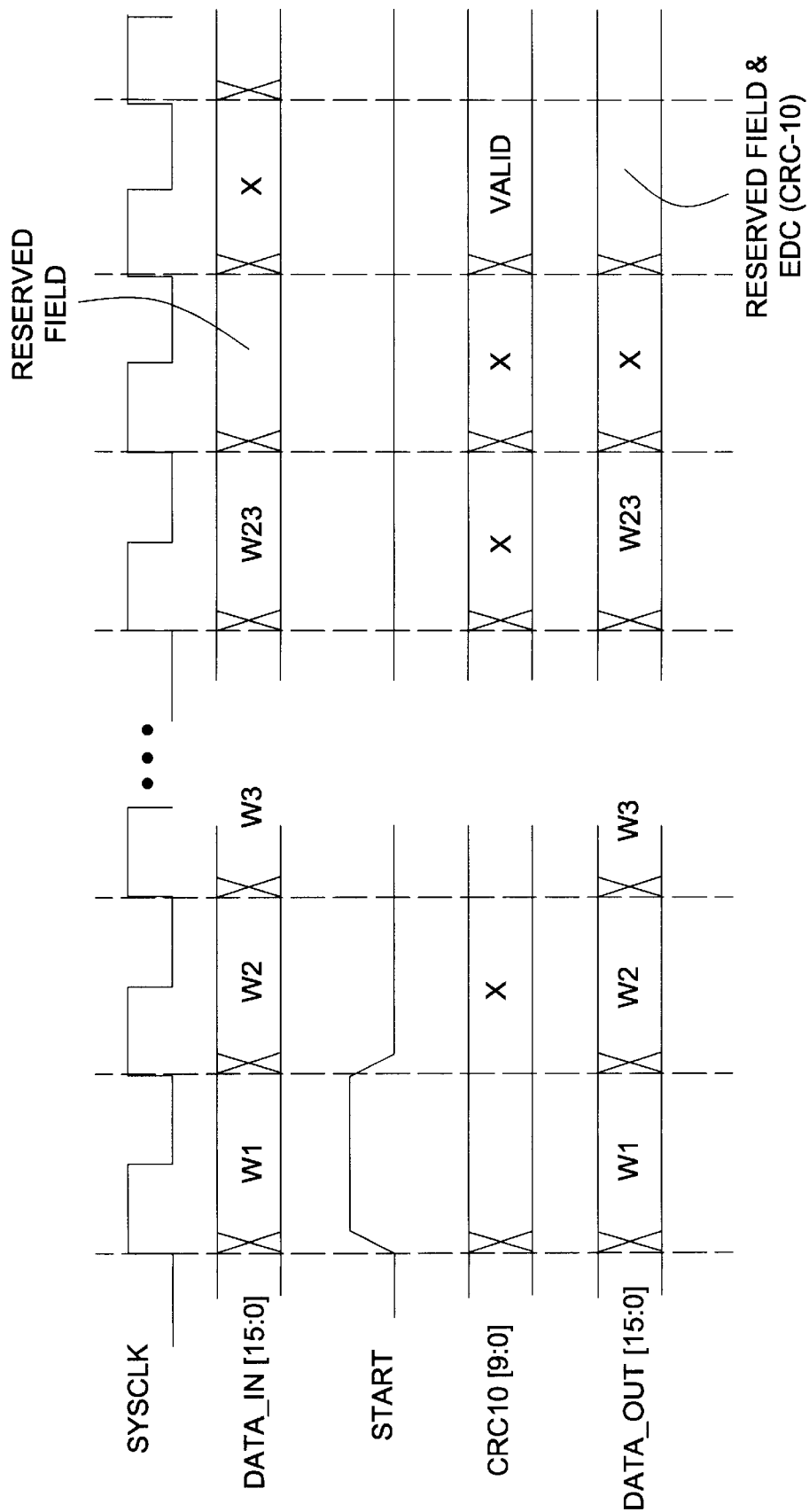
FIG. 4 is a timing diagram of corresponding signals of FIG. 3, in accordance with the prior art.

However, with reference to FIG. 4, timing diagrams of the prior art, it may be seen that the crc10(9:0) output does not become valid until one sysclk cycle after the final payload data word W23 is input. Thus, a conventional CRC-10 generator delays the output an additional sysclk cycle so that the CRC-10 field could be appended to the cell. This is avoided in the present invention by performing a look-ahead calculation on the EDC in addition to the final payload data word W23.

The invention can be implemented in a processor, an ASIC, or another circuit designed to implement it. If implemented in a processor, the CRC-10 calculation can be provided by operating it in accordance with a program described in the pseudo-code listed in Appendix A. Actual CRC-10 VHDL code is listed in Appendix B.

A person understanding this invention may now conceive of alternative structures and embodiments or variations of the above. All those which fall within the scope of the claims appended hereto are considered to be part of the present invention.

Appendix A n: Input data word length
r[9:0]: crc-10 residue
r[9]:="4[9]"; etc.
r[0]:="r[0]";
tmp[9:0]: temporary sring holders.
Here are the equations for the general input data.

```
For i = n-1 to 0
{           tmp[0] := r[9] & "data_in[i];
            tmp[1] := r[0] & r[9] & "data_in[i]";
            tmp[2] := r[1];
            tmp[3] := r[2];
            tmp[4] := r[3] & r[9] & "data_in[i]";
            tmp[5] := r[4] & r[9] & "data_in[i]";
            tmp[6] := r[5];
```

-continued

```
            tmp[7] := r[6];
            tmp[8] := r[7];
            tmp[9] := r[8] & r[9] & "data_in[i]";
            r[0] := tmp[0];
            etc.
            r[9] := tmp[9];
}
For i = 9 to 0
{           For j = 1 to length(r[i])
            {   If ((the sum of each unique
                string token of [i]
                modulo 2 !=0 ) then
                identify this as an element of
                the parallel equation for r[i];
            else
            Don't retain this element for
            r[i]
                end if;
            }
}
```

The remaining unique tokens for each r[i] are the parallel crc-10 equations for a data-path of length n.

APPENDIX B

```
--                                copyright 1995
--                                PMC-Sierra, Inc.
--                                All Rights Reserved
-- File name    :   crc10.vhd
-- Title        :   crc10 generator
-- Module       :   This file computes the CRC-10 of an OAM cell payload.
--
-- Purpose      :   The crc-10 generating polynomial is:
--                  G(x) = 1 + x + x^4 + x^5 + x^9 + x^10
--
--
--      IF (eop = '0') THEN
--          -- This first loop handles the general
--          data_loop1 : FOR n IN 15 downto 0 LOOP
--              c(10) := c(9) XOR data_in(n);
--              c(9) := c(8) XOR c(10);
--              c(8) := c(7);
--              c(7) := c(6);
--              c(6) := c(5);
--              c(5) := c(4) XOR c(10);
--              c(4) := c(3) XOR c(10);
--              c(3) := c(2);
--              c(2) := c(1);
--              c(1) := c(0) XOR c(10);
--              c(0) := c(10);
--          END LOOP data_loop1;
--      ELSE
--          data_loop2 : FOR n IN 5 downto 0 LOOP
--              c(10) := c(9) XOR '0';
--              c(9) := c(8) XOR c(10);
--              c(8) := c(7);
--              c(7) := c(6);
--              c(6) := c(5);
--              c(5) := c(4) XOR c(10);
--              c(4) := c(3) XOR c(10);
--              c(3) := c(2);
--              c(2) := c(1);
--              c(1) := c(0) XOR c(10);
--              c(0) := c(10);
--          END LOOP data_loop2;
--      END IF;
--      Modification History :
--              Date            Author          Revision    Comments
--      Fri May 19 11:49:32 1995   Maher Fahmi     Rev A       Creation
```

-continued

APPENDIX B

---

```
LIBRARY IEEE;
LIBRARY compass_lib;
Library Pm7120_Lib ;
USE ieee.std_logic_1164.ALL;
USE compass_lib.compass.ALL;
Use Pm7120_Lib.pm7120_kg.ALL;
ENTITY crc10 IS
    GENERIC (tPcrc10 : TIME := 1 ns);
    PORT    (rstb       : IN std_logic;
             sysclk     : IN std_logic;
             data_in    : IN std_logic_vector(15 DOWNTO 0);
             sop        : IN std_logic;
             eop        : IN std_logic;
             data_out   : OUT std_logic_vector(15 DOWNTO 0));
END crc10;
ARCHITECTURE behav OF crc10 IS
    SIGNAL data_out_i : std_logic_vector(15 downto 0);
BEGIN -- behav
    -- sop :  Start of Payload.
    -- eop :  End of Payload.
    -- enb :  Enable Bar. Active low signal to allow state update.
    --        if (enb_s = '0'), then update state.
    --        else retain state.
    -----------------------------------------------------------------
    -- Process:   crc_calc
    -- Purpose:   This calculates the crc10 of an OAM cell payload.
    -- Inputs:    rstb, sysclk, data_in
    -- Outputs:   data_out_i
    -----------------------------------------------------------------
    crc_calc : PROCESS (rstb, sysclk)
        VARIABLE new_c : std_logic_vector(9 downto 0);
        VARIABLE c : std_logic_vector(9 downto 0);
    BEGIN -- PROCESS crc_calc
        IF (rstb = '0') THEN
            new_c := (others => '0');
            c := (others => '0');
            data_out_i <= (others => '0');
        ELSIF (rising_edge(sysclk)) THEN
            IF (eop = '0') THEN
                IF (sop = '1') THEN
                    c := (others => '0');
                ELSE
                    c := c;
                END IF;
                new_c := (others => '0');
                -- If this is not the final payload word, then the following
                -- set of equations covers the CRC-10 state machine.
                new_c(0)  :=  c(9) XOR data_in(15) XOR c(3) XOR data_in(9)
                              XOR data_in(4) XOR data_in(3) XOR data_in(2)
                              XOR data_in(1) XOR data_in(0);
                new_c(1)  :=  c(9) XOR data_in(15) XOR c(4) XOR data_in(10)
                              XOR c(3) XOR data_in(9) XOR data_in(5)
                              XOR data_in(0);
                new_c(2)  :=  c(5) XOR data_in(11) XOR c(4) XOR data_in(10)
                              XOR c(0) XOR data_in(6) XOR data_in(1);
                new_c(3)  :=  c(6) XOR data_in(12) XOR c(5) XOR data_in(11)
                              XOR c(1) XOR data_in(7) XOR data_in(2);
                new_c(4)  :=  c(9) XOR data_in(15) XOR c(7) XOR data_in(13)
                              XOR c(6) XOR data_in(12) XOR c(3) XOR data_in(9)
                              XOR c(2) XOR data_in(8) XOR data_in(4)
                              XOR data_in(2) XOR data_in(1) XOR data_in(0);
                new_c(5)  :=  c(9) XOR data_in(15) XOR c(8) XOR data_in(14)
                              XOR c(7) XOR data_in(13) XOR c(4) XOR data_in(10)
                              XOR data_in(5) XOR data_in(4) XOR data_in(0);
                new_c(6)  :=  c(0) XOR c(9) XOR data_in(15) XOR c(8)
                              XOR data_in(14) XOR c(5) XOR data_in(11)
                              XOR data_in(6) XOR data_in(5) XOR data_in(1);
                new_c(7)  :=  c(1) XOR c(9) XOR data_in(15) XOR c(6)
                              XOR data_in(12) XOR data_in(7) XOR c(0)
                              XOR data_in(6) XOR data_in(2);
                new_c(8)  :=  c(2) XOR c(7) XOR data_in(13) XOR data_in(8)
                              XOR c(1) XOR data_in(7) XOR data_in(3);
                new_c(9)  :=  (C9) XOR data_in(15) XOR c(8) XOR data_in(14)
                              XOR c(2) XOR data_in(8) XOR data_in(3)
                              XOR data_in(2) XOR data_in(1) XOR data_in(0);
            ELSIF (eop = '1') THEN
```

APPENDIX B -continued

```
             -- This is the end of payload word, so we must use an
             -- alternate set of equations.
             new_c(0)  :=  c(7) XOR data_in(13) XOR c(4) XOR c(5)
                           XOR data_in(11) XOR data_in(10) XOR c(3)
                           XOR data_in(9) XOR data_in(3);
             new_c(1)  :=  c(8) XOR data_in(14) XOR c(6) XOR c(7)
                           XOR data_in(13) XOR data_in(12) XOR c(3)
                           XOR data_in(9) XOR data_in(4) XOR data_in(3);
             new_c(2)  :=  c(9) XOR data_in(15) XOR c(7) XOR c(8)
                           XOR data_in(14) XOR data_in(13) XOR c(4)
                           XOR data_in(10) XOR data_in(5) XOR data_in(4)
                           XOR data_in(0);
             new_c(3)  :=  c(8) XOR c(9) XOR data_in(15) XOR data_in(14)
                           XOR c(5) XOR data_in(11) XOR c(0) XOR data_in(6)
                           XOR data_in(5) XOR data_in(1);
             new_c(4)  :=  c(9) XOR data_in(15) XOR c(7) XOR data_in(13)
                           XOR c(3) XOR c(4) XOR c(5) XOR c(6)
                           XOR data_in(12) XOR data_in(11) XOR data_in(10)
                           XOR data_in(9) XOR c(1) XOR data_in(7) XOR c(0)
                           XOR data_in(6) XOR data_in(3) XOR data_in(2);
             new_c(5)  :=  c(3) XOR c(8) XOR data_in(14) XOR c(6)
                           XOR data_in(12) XOR data_in(9) XOR c(2)
                           XOR data_in(8) XOR c(1) XOR data_in(7)
                           XOR data_in(4);
             new_c(6)  :=  c(4) XOR c(9) XOR data_in(15) XOR c(7)
                           XOR data_in(13) XOR data_in(10) XOR c(3)
                           XOR data_in(9) XOR c(2) XOR data_in(8)
                           XOR data_in(5) XOR data_in(0);
             new_c(7)  :=  c(5) XOR c(8) XOR data_in(14) XOR data_in(11)
                           XOR c(4) XOR data_in(10) XOR c(3) XOR data_in(9)
                           XOR c(0) XOR data_in(6) XOR data_in(1)
                           XOR data_in(0);
             new_c(8)  :=  c(6) XOR c(9) XOR data_in(15) XOR data_in(12)
                           XOR c(5) XOR data_in(11) XOR c(4) XOR data_in(10)
                           XCR c(1) XOR data_in(7) XOR data_in(2)
                           XOR data_in(1);
             new_c(9)  :=  c(6) XOR data_in(12) XOR c(3) XOR c(4)
                           XOR data_in(10) XOR data_in(9) XOR c(2)
                           XOR data_in(8) XOR data_in(2);
        ELSE
             -- Enable_s must be high
             new_c := c;
        END IF;
        c := new_c;
        data_out_i <= "000000" & new_c;
    END IF;
END PROCESS crc_calc;
             -- If you are synthesizing, comment out the data_out
             -- assignment, and "de-comment" the following line:
             --
             -- data_out <= data_out_i after tPcrc10;
             --
             -- This is because Compass can't handle the delayed bus
             -- assignment.
    data_out <= data_out_i after tPcrc10;
END behav;
```

We claim:

1. A method of determining an error detection code (EDC) on incoming data which includes a reserved bit field, comprising:

(a) applying the incoming data to inputs of both an input data CRC (IDC) calculator and to an input data and reserved field CRC (IDRC) calculator, (b) calculating the EDC on successive input data words and recursively updating the EDC in both the IDC and IDRC calculators, (c) selecting a payload of the input data as a system output signal for all payload words, and (d) subsequently selecting an output EDC word from the IDRC calculator in a time immediately following a final payload word which contains the reserved field.

2. A method as defined in claim 1, including delaying the output EDC word from the IDRC calculator for a one word interval for establishing said time immediately following the final payload word.

3. A method as defined in claim 2 including processing the input data in each calculator using an EDC polynomial having a wordlength which is smaller than a wordlength of the input data.

4. A method of calculating an error detection code (EDC) on incoming data having words in parallel format and having a final word which includes a reserved bit field, comprising calculating an EDC on successive words of an input bit stream, applying successive words of the input bit stream to an output bus, performing a look-ahead EDC calculation on the final word, and applying the result of the EDC calculation on the final word in a time interval immediately following the final word on the output bus.

5. A method as defined in claim 4 in which the data is in ATM protocol.

6. A system for determining an error detection code (EDC) on a bit stream comprising a payload formed of a sequence of words followed by a reserved field, comprising:

(a) A input data CRC (EDC) calculator, (b) An input data and reserved field CRC (IDRC) calculator, (c) means for applying input data in parallel format to inputs of said calculators, (d) first means for selecting an output of either of said calculators to a CRC output, (e) first delaying means for delaying by a word interval the output of either of said calculators prior to application of said output to the CRC output, (e) means for applying a signal from the delayed CRC output to recursive update inputs of said calculators, (f) second means for selecting either said input data or said signal from the delayed CRC output to a system output, (g) means for applying a signal to said first means, for selecting an output of said EDC calculator for application to the delaying means for application to the delayed CRC output during an interval of each word of said input data until the occurrence of a last input word, and for subsequently selecting an output of said IDRC calculator for application to the delaying means for application to the delayed CRC output during said last input word, and (h) means for applying a signal to said second means for selecting said input data to said system output during an interval of each word of said input data, and for selecting said delayed CRC output during an interval following said last input word.

7. A system as defined in claim 6, in which each of the selecting means is a multiplexer.

8. A system as defined in claim 7 in which the signal applied to the first means for selecting is comprised of a pulse which changes from one to another logic level during an interval of said last input word applied to a select input of the first means for selecting, and in which the signal applied to the second means for selecting is comprised of said pulse, delayed by one word length.

9. A system as defined in claim 8 including second means for delaying said pulse comprising a flip flop having said pulse applied to an input of the flip flop, a clock signal applied to a clock input of the flip flop, and an output connected to a select input of the second means for selecting.

* * * * *